(12) United States Patent
Hossu

(10) Patent No.: US 9,958,988 B2
(45) Date of Patent: May 1, 2018

(54) METHOD FOR OPTICALLY DETECTING A FINGERPRINT OR AN OBJECT, AND DEVICE WITH AT LEAST ONE SCREEN

(71) Applicant: Dan Hossu, Hoppstaedten-Weierbach (DE)

(72) Inventor: Dan Hossu, Hoppstaedten-Weierbach (DE)

(*) Notice: Subject to any disclaimer, the term of this patent is extended or adjusted under 35 U.S.C. 154(b) by 0 days. days.

(21) Appl. No.: 14/893,006

(22) PCT Filed: May 21, 2014

(86) PCT No.: PCT/DE2014/100176
§ 371 (c)(1),
(2) Date: Nov. 20, 2015

(87) PCT Pub. No.: WO2014/198259
PCT Pub. Date: Dec. 18, 2014

(65) Prior Publication Data
US 2016/0110025 A1 Apr. 21, 2016

(30) Foreign Application Priority Data
Jun. 12, 2013 (DE) .................. 10 2013 106 105

(51) Int. Cl.
*G06K 9/00* (2006.01)
*G06F 3/042* (2006.01)
(Continued)

(52) U.S. Cl.
CPC .......... *G06F 3/0421* (2013.01); *G06F 3/0412* (2013.01); *G06F 3/0416* (2013.01);
(Continued)

(58) Field of Classification Search
CPC .... G06F 3/0412; G06F 3/0416; G06F 3/0421; G06K 9/00013; G06K 9/0004; G06K 9/2027; H01L 27/323; H01L 27/3234
(Continued)

(56) References Cited

U.S. PATENT DOCUMENTS 5,534,693 A * 7/1996 Kondo ..................... G01D 5/38
250/231.16
6,469,755 B1 * 10/2002 Adachi ................ G02B 6/0018
349/62
(Continued)

FOREIGN PATENT DOCUMENTS

| CN | 103105978 A | 5/2013 |
| EP | 1158775 A1 | 11/2001 |
| WO | 2004088627 A1 | 10/2004 |

OTHER PUBLICATIONS

International Search Report, dated Aug. 10, 2014, EPO.

*Primary Examiner* — Mekonen Bekele
(74) *Attorney, Agent, or Firm* — Johnson, Marcou & Isaacs, LLC; Jennifer S. Stachniak

(57) ABSTRACT

In a method for optically capturing a fingerprint or an object on a surface (2) of a cover plate (1) of a screen with a plurality of photosensors (4) which are each assigned to a respective display pixel (6), the display pixels (6) emit light radiation and the photosensors (4) capture light radiation from the display pixels (6) reflected by the surface (2) within a scan angle (8). The scan angle (8) describes in a virtual mirror image plane (9) the size of the display pixel (6).

26 Claims, 3 Drawing Sheets

(51) Int. Cl.
  *G06K 9/20* (2006.01)
  *G06F 3/041* (2006.01)
  *H01L 27/32* (2006.01)

(52) U.S. Cl.
  CPC ....... *G06K 9/0004* (2013.01); *G06K 9/00013* (2013.01); *G06K 9/2027* (2013.01); *H01L 27/323* (2013.01); *H01L 27/3234* (2013.01)

(58) Field of Classification Search
  USPC ................................. 382/124, 115; 345/173
  See application file for complete search history.

(56) References Cited

U.S. PATENT DOCUMENTS

| | | | | |
|---|---|---|---|---|
| 8,605,059 | B2* | 12/2013 | Kurokawa | G06F 3/042 178/18.09 |
| 8,723,806 | B2* | 5/2014 | Kim | G02F 1/13338 345/104 |
| 2004/0252867 | A1* | 12/2004 | Lan | G06K 9/0004 382/124 |
| 2006/0227400 | A1* | 10/2006 | Gupta | G02B 5/04 359/238 |
| 2008/0018612 | A1* | 1/2008 | Nakamura | G06F 3/0354 345/173 |
| 2008/0122803 | A1 | 5/2008 | Izadi et al. | |
| 2009/0122024 | A1* | 5/2009 | Nakamura | G06F 3/0416 345/173 |
| 2010/0156851 | A1* | 6/2010 | Kurokawa | G06F 3/0412 345/175 |
| 2010/0201275 | A1 | 8/2010 | Cok et al. | |
| 2011/0248147 | A1* | 10/2011 | McKee | H01L 27/14603 250/208.1 |
| 2013/0207903 | A1* | 8/2013 | Yeh | G06F 3/041 345/173 |
| 2014/0003678 | A1* | 1/2014 | Vieta | G06K 9/00026 382/124 |

* cited by examiner

METHOD FOR OPTICALLY DETECTING A FINGERPRINT OR AN OBJECT, AND DEVICE WITH AT LEAST ONE SCREEN

The instant application claims the priority date of May 21, 2014, the filing date of the international patent application PCT/DE2014/100176.

BACKGROUND OF THE INVENTION

The invention relates to a method for optically capturing a fingerprint or an object, and an apparatus with at least one screen, the screen comprising an upper optical cover plate under which a plurality of display pixels are arranged as light sources for the image to be represented.

Such apparatuses are known as display apparatuses with screens of any desired configuration. For example, LED or preferably OLED screens in mobile devices, for example in what are known as smart phones or tablet computers, are used as high-resolution touch screens. The problem here is, for example, data security when using such mobile devices which, because of a compact construction, have no space for incorporating a fingerprint reader, for example.

Fingerprint recognition systems comprise generally capacitive or optical surface sensors for capturing characteristic features of a fingertip. The recorded signals are often compared by a recording device with fingerprint features of authorized persons that are stored in a memory. If the fingerprint recorded by the fingerprint sensor matches a stored fingerprint pattern in terms of significant features, the recording device outputs a corresponding signal to an evaluation and control device which, for example, unlocks a door lock. If, for example, an unauthorized person tries to gain access, this is detected when comparing the recorded fingerprint features of the unauthorized person to the stored fingerprint features, and a signal transmission to the evaluation and control device is either suppressed or a failed-attempt signal is transmitted.

Furthermore, DE 699 20 126 T2 illustrates a fingerprint reader with a light source, a photosensor device comprising a plurality of photosensors formed on the light source and a surface formed on the photosensors, and a see-through, light-conducting layer formed on the photosensor device. The arrangement of such a fingerprint reader in particular in what are known as smart phones or tablet computers is a problem, since here little space is available as installation space in a housing, but relatively high data security and thus effective access control is desired.

Moreover, a surface-capacitive touch screen is known which substantially a film coated with a see-through metal oxide, which is laminated onto a transparent carrier plate, usually glass. An alternating voltage is applied to the corners of the coating so as to generate an electric field. In the event of contact by touch, a small charge transport is produced which is measured in the discharge cycle in the form of a current at the corners. The resulting currents from the corners are in direct relationship with the touch position.

SUMMARY OF THE INVENTION

The invention is based on the object of providing a method and an apparatus of the type mentioned in the introduction which permit both a display function and a read function.

In a method for optically capturing a fingerprint or an object on a surface of a cover plate of a screen having a plurality of photosensors which are assigned in each case to a display pixel, the display pixels emits light radiation and the photosensors capture light radiation from the display pixels reflected by the surface within a scan angle, with the scan angle describing in a virtual mirror image plane the size of the display pixel.

The mirroring of the display pixel at the surface of the cover plate determines the size of the scan angle of the photosensor, wherein the size of the display pixel in the virtual mirror image plane is to be described by the scan angle. The display pixels of the screen serve for representing an image in the screen function and for illuminating a finger or other object to be scanned in the fingerprint recognition or scan function. The photosensor is matched in terms of its scan angle to the size of the display pixel. If the display pixel mirrors itself, that is to say is present on the cover plate in the region of the scan angle of the photosensor, a relatively large proportion of the emitted light radiation is received by the photosensor and only a relatively small proportion is transmitted to behind the surface of the cover plate. When a finger is placed thereon, only a relatively small proportion of the emitted light radiation is reflected and received by the photosensor and a relatively large proportion of the light radiation behind the surface is absorbed by the finger owing to the optical coupling. At the transition cover plate/air, approximately 4% is reflected back, and in the case of a finger placed on the cover plate, far less than 1% is reflected back. The proximity of the display pixel has the effect that here the 4% represents a lot of light, significantly more than would be reflected for example by a scanned object behind the surface.

In the scan function, specific subpixels of the display pixels are driven for emitting light radiation, wherein the photosensors assigned to said display pixels are passive and the active photosensors in neighboring switched-off display pixels partially capture the light radiation reflected at the object, for example a document to be captured. Owing to the driving of different display pixels or subpixels for illumination and photosensors for capturing reflected light radiation, half images are produced which, in a correspondingly overlaid state, result in a total image of the document to be scanned. If the photosensor assigned to the luminous display element were to be switched on during scanning of the document, there would be a risk of capturing reflected light proportions of the own display pixel, which would cause undesired fogging.

An apparatus, in particular for carrying out the method explained above, comprises at least one screen having an upper optical cover plate under which a plurality of display pixels are arranged as light sources for the image to be represented. One photosensor is assigned in each case, in a centered fashion, to a plurality of display pixels.

The display pixels of the display transmit light directly through the upper cover plate, which is of course transparent, to its outer surface. The photosensor receives, under a specific scan angle, light from the display pixel assigned thereto, which is reflected at the surface, that is to say mirrored.

Accordingly, and the light radiation reflected by the surface is transmitted to the photosensor by the light source configured as display pixels, which light source transmits any desired radiation, that is to say also for example infrared radiation, in an incident light method to the surface with the object to be optically scanned, in particular a finger. The transmission of the light radiation is effected within the previously determined scan angle of the photosensor. What is used here is the optical property of the cover plate that, at the exit, the light beam couples into the medium located there better or worse owing to the refractive index of the medium, and as a result a greater or lesser amount of light is reflected back. The human skin acts as a medium having a higher refractive index than air. By using the incident light method, the apparatus can better register brightness changes of the reflected light at a relatively low radiation intensity as compared to the transmitted light method. Recognizing objects on the cover plate or on the screen can be used for example as a control function. The touch screen functions if photosensors are distributed over the entire screen and not capacitively, as is known from the prior art, wherein of course after a corresponding surface coating and the application and monitoring of a corresponding voltage this function is of course not excluded.

In terms of configuration, the photosensors are arranged in a central free space of the associated display pixel, in particular surrounded by subpixels, or on that side of the display pixels that is opposite the cover plate. When the photosensors are arranged behind the display pixels, that is to say on that side that is opposite the cover plate, a substantially known display device, for example an OLED, can be used without significant changes. In conjunction with an OLED, the further advantage is obtained that the attachment of the display-pixel-related photosensor permits measurement of the brightness and color shift of each individual display pixel and subpixel. A suitable evaluation unit can subsequently correct the brightness of the subpixels. This permits a simple and cost-effective solution to the variable aging of the subpixels in an OLED, the colors of which are, as is known, subject to variable aging. Preferred is the measurement of the own display pixel, in the fingerprint mode, since here the actual color is measured by the own photosensor. A measurement of a background color with switched-off display pixels and inclusion of these values in the evaluation improve the measurement accuracy. The use of an object for the calibration, for example a sheet of white paper or a gray object, can likewise be used for calibration. In this case, the paper or the object is captured in scan mode.

Preferably, at least one of the display pixels or a subpixel of the display pixel emits radiation in the infrared or ultraviolet range. When arranging a display pixel emitting light in the infrared range, it is possible to capture a position of an object, for example a finger. Display pixels that emit in the UV range may also be provided, in particular for security applications.

Alternatively or additionally, the display pixels or a subpixel preferably emit monochromatic or colored light. The monochromatic light may be for example red, green or blue light or else infrared light.

Expediently, each display pixel comprises a plurality of subpixels. The subpixels can be arranged for example around the photosensor.

The display pixels are component parts of an OLED so as to provide a relatively thin screen.

According to one development, each photosensor comprises a color filter and/or each photosensor is assigned a mask, in particular a metallized mask, for screening against direct illumination by the display pixels. So as to detect colored light which is reflected, it is necessary for the photosensor to comprise three individual receivers with in each case a red green blue (or a complementary yellow magenta cyan) color filter, in particular sub-photosensors. The preferably metallized mask is used to screen the photosensor against direct irradiation, since the mask keeps the photosensitive element in the shadow of the light source, that is to say of the display pixels. Preferably, a fourth individual receiver of the photosensor can separately capture, without color filter, the infrared radiation of the correspondingly configured display pixel.

So as to focus the reflected light onto the assigned photosensor, each photosensor is preferably assigned a microlens, preferably configured as a Fresnel lens or holographic lens. The arrangement or formation of a microlens can be necessary starting from a specific thickness of the cover plate, for example from a thickness of 50 to 100 µm. The microlens is expediently arranged between the cover plate and the photosensor.

In a further embodiment, at least the display pixels and the photosensors are connected to a computer unit and a memory module.

According to one development, a switching apparatus coupled to the computer is provided in order to either a fingerprint recognition mode, in which all display pixels emit light radiation and the photosensors thereof that are assigned thereto capture reflected light radiation, or a scan mode, in which the display pixels are switched on and off sequentially in the pattern of a chessboard or in the form of lines and columns so as to emit light radiation, and the photosensors of the respectively switched-off display pixels are switched on to receive the reflected light radiation. In both modes, the position of a finger or other object on the surface of the cover plate can be ascertained by the computer and the touch screen functionality is ensured.

In order to provide a thin and unbreakable screen, the cover plate is preferably configured as a flexible plastic film. The plastic film is preferably uncovered, hard-covered or covered by a further film, preferably a graphene film, and/or consists of a plurality of layers film. Corresponding coatings, laminates or the like are known to a person skilled in the art for protecting optical surfaces. Graphene is the designation for a modification of carbon with a two-dimensional structure, in which each carbon atom is surrounded at an angle of 120° by three further ones, such that a honeycomb pattern is formed. Graphene surface crystals have a high rigidity and strength and only slightly attenuate light in the visible wavelength range.

When the above-explained device is used as a fingerprint sensor and/or a document scanner and/or a touch screen for a mobile telephone, a smart phone, a tablet computer or a stationary novel work screen computer, fingerprints can be stored for example in the manner of an authorization and be compared with a scanned fingerprint on the screen. It is also possible to place a document or a screen of a second device onto the first device to be scanned, or to move it into the direct vicinity thereof. As already explained, the capturing of a fingerprint or of another object on the screen can also be used to determine the position thereof, such that the screen serves as a touch screen. In the case of a large screen, for example with a screen diagonal of 60" or more, of a work screen computer that lies flat on the table like a large television screen, it is possible to work as a team, with each team member, recognized by their fingerprint, working with his or her own application and authorization, and to scan documents at the same time.

The apparatus described represents a touch screen with a multiple-use scanner in a device of relatively thin construction, which can be used both in a mobile device and in a stationary device. The apparatus permits the scanning of fingerprints on the screen surface and thus coupling of the screen contents to the security that is brought about by the biometric feature of the fingerprint. Furthermore, it is possible with the apparatus to scan documents and objects directly on the screen surface, wherein the scans can be monochrome, colored or multispectral (additionally IR and/ or UV). Moreover, the apparatus permits a relatively large and precise "multitouch function" as compared to the capacitive technology according to the prior art. A cost-effective plastic film can be used in the apparatus, as can hardened glass, such that it is also possible to produce unbreakable and extremely lightweight mobile devices, in particular in conjunction with the cover made of plastic.

The apparatus permits the use of software, in particular in the form of what are known as apps, only if a registered fingerprint is present, as a result of which security is implied in the software if it must be launched with a fingerprint. A further security-relevant application is, for example, reliable shopping on the Internet by simplified authentification, wherein this in combination with a virtual keyboard can be increased by assigning in each case one fingerprint to a plurality of characters of the virtual keyboard.

With the apparatus, calibrated color scans and the establishment of a "color database" which comprises colors of own objects, such as for example items of clothing which were scanned, are possible. This "color database" can be used when shopping for color-matched objects on the Internet.

If two apparatuses or mobile devices with integrated apparatuses are held against one another by way of their screens substantially without a gap, data can be exchanged, without being spied on, by the numerous optical transmitter/receivers, that is to say the display pixels and the photosensors.

It is to be understood that the previously mentioned features and the features still to be explained below can be used not only in the respectively stated combination but also in other combinations. The scope of the invention is defined only by the claims.

BRIEF DESCRIPTION OF THE DRAWINGS

The invention will be explained in more detail below with reference to exemplary embodiments using the associated drawing.

DETAILED DESCRIPTION OF SPECIFIC EMBODIMENTS

Figure 1:
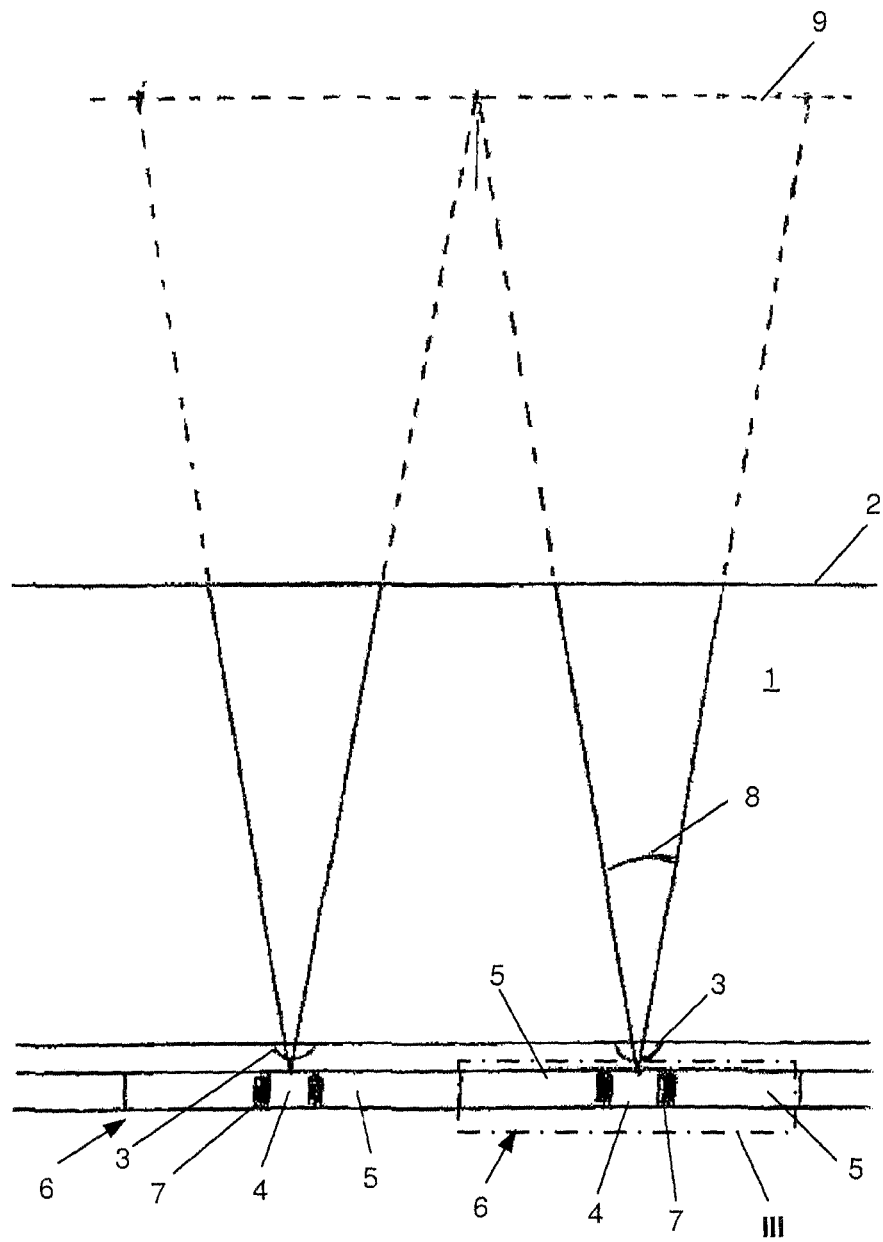
FIG. 1 shows a schematic illustration of a cross section of an apparatus according to the invention.
Figure 5:
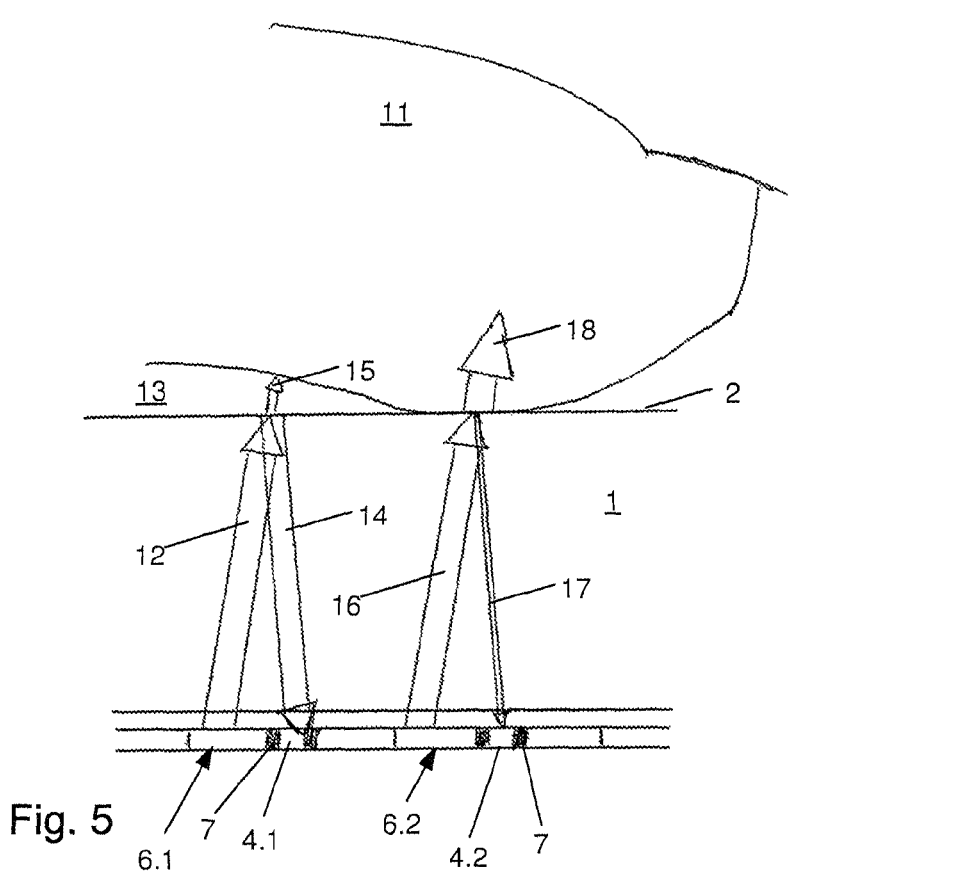
FIG. 5 shows a schematic illustration of a cross section of an apparatus according to FIG. 1 in an alternative configuration with a finger placed thereon.
Figure 6:
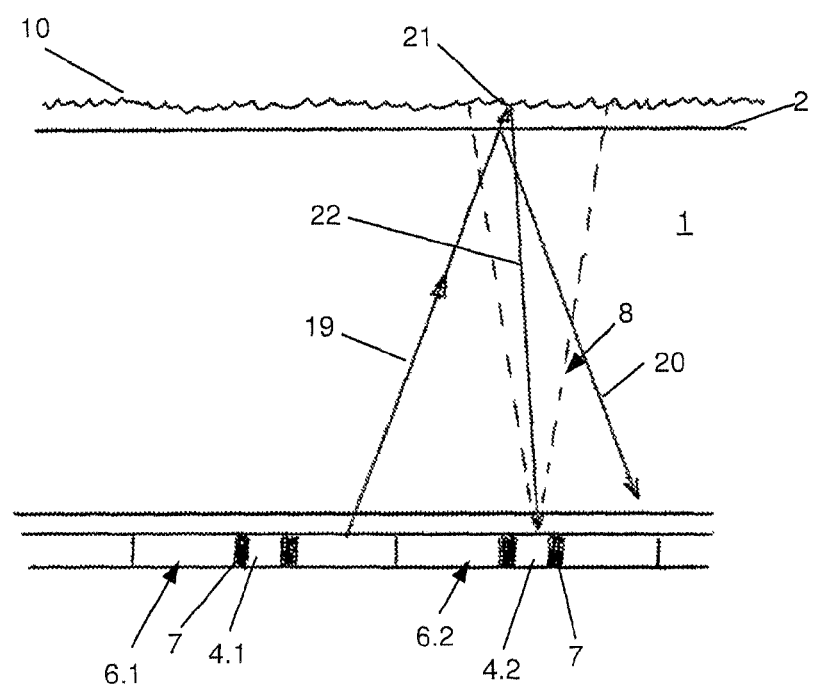
FIG. 6 shows a schematic illustration of a cross section of an apparatus according to FIG. 5 with a document placed thereon.

The apparatus according to FIG. 1 comprises an optical cover plate 1, on the surface 2 of which an object to be scanned is placed, in particular a document 10 or a finger 11 for capturing a fingerprint, wherein the cover plate 1 can be made from glass or plastic, in particular as a relatively thin plastic film. On that side of the cover plate 1 that is opposite the surface 2, microlenses 3 are provided, which may be omitted in the case of a sufficiently thin cover plate 1, as is illustrated in FIGS. 5 and 6. The microlenses 3 are assigned photosensors 4 which are located in the center of display pixels 6 comprising subpixels 5. The subpixels 5 can be configured in various colors, preferably red, green or blue, or emit such colored light, also monochromatic light. Additionally, it is also possible to arrange an infrared-light-emitting subpixel 5 so as to ascertain the position of the object to be scanned even when it is dark. For particular security applications, UV-light-emitting subpixels 5 may also be provided. Any desired combination of colors is conceivable. So as to protect the photosensor 4 against direct light incidence, that is to say in order to prevent that the light emitted by the display pixels 6 enters the photosensor 4 directly, said photosensor is provided with a shading mask 7, for example in the form of a metallization.

Figure 2:
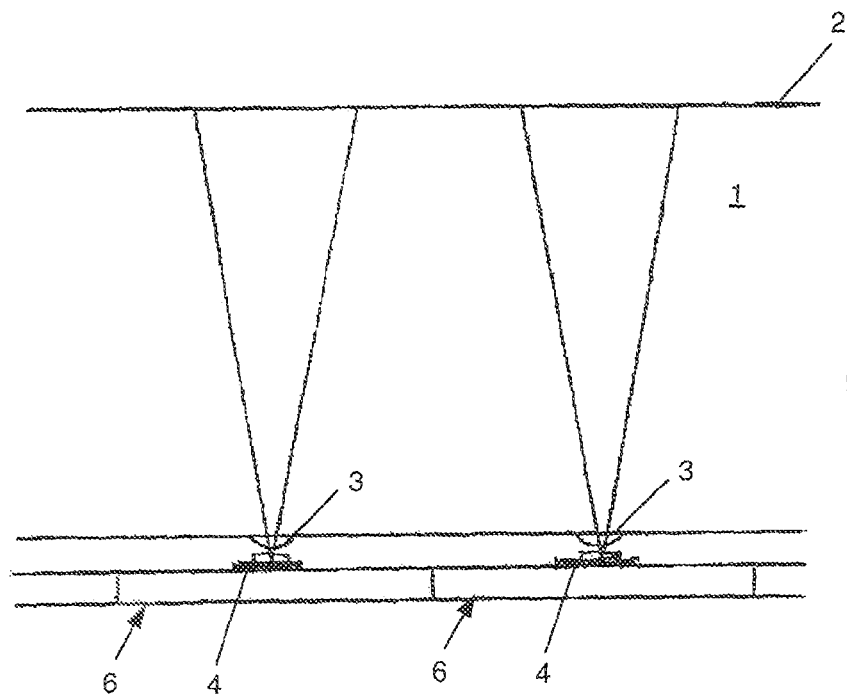
FIG. 2 shows a schematic illustration of a cross section of an apparatus according to FIG. 1 in an alternative configuration.

According to FIG. 2, the photosensor 4 is placed on a display pixel 6, after which it is possible to mount photosensors 4 for example on an OLED display.

Figure 3:
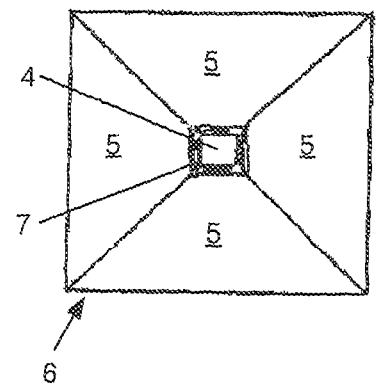
FIG. 3 shows a top view of the schematic illustration of a detail III according to FIG. 1.
Figure 4:
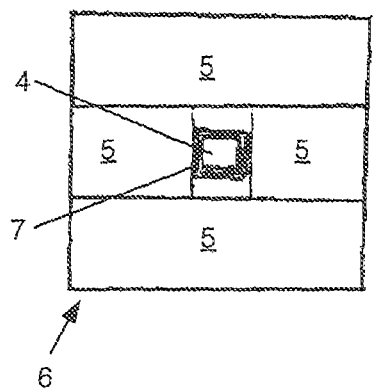
FIG. 4 shows a top view of the schematic illustration of the detail III according to FIG. 1 in an alternative configuration.

FIGS. 3 and 4 show how the photosensor 4 is to be positioned at a display pixel 6, or how the subpixels 5 of a display pixel are to be positioned with respect to the photosensor 4. What appears to be important according to previous findings is the arrangement of the photosensor 4 in the center of the display pixel 6, so that it captures the reflection of the light beams emitted by the display pixels 6 under the scanning angle 8.

As is known to the person skilled in the art, brightness changes are captured by the photosensors 4, which are caused by the objects placed on the cover plates or a lack of objects, wherein the brightness changes are caused owing to reflections.

The size of the scanning range of the photosensor, that is to say the scan angle thereof, is matched to the size of the display pixel 6, wherein the relationships are schematically shown in FIG. 1. So as to measure only the brightness of the own display pixel, the scan angle 8 must not exceed the following size:

$$\alpha \leq 2 \arctan(d/4h_1)$$

wherein:

α scan angle 8 d edge length of the display pixel 6

$h_1$ distance from the upper side of the display pixel to the surface 2 of the cover plate This size of the capturing range of the photosensor 4 that is determined by the scan angle 8 corresponds to the size of the display pixel 6 in the virtual mirror plane 9.

If the scan angle 8 were to be exceeded, the impact on the contrast would be negative, up to a loss of the possibility of scanning. With a relatively thick transparent cover plate 1, the scan angle 8 of the photosensor 4 is adjusted using the microlens 3 to the necessary dimension.

When using the apparatus as a fingerprint scanner, the display pixels 6 transmit the light directly through the transparent cover plate 1 to the surface 2 thereof. The photosensors 4 are situated within the shadow of the assigned masks 7 and are not exposed by direct light irradiation from the display pixels 4. Each photosensor 4 receives, under the scan angle 8, the light that is emitted by the display pixels 6 surrounding it or the subpixels 5 thereof and is mirrored at the surface 2 of the cover plate 1.

In this case, the light quantity reflected at the surface 1 depends on whether or not a finger 11 is in contact with the surface 2 and the light is coupled into the finger, as already explained further above and below with reference to the illustration according to FIG. 5.

FIG. 5 in particular does not reflect the true dimensional relationships, since a large number of display pixels 6 are of course assigned to a finger placed on the cover plate 1, and not just one display pixel 6, as shown.

The display pixel 6.1 illustrated on the left-hand side transmits a light beam according to arrow 12 to the surface 2 of the cover plate 1, at which a transition from the cover plate 1 into air 13 takes place, with the refractive indices of the cover plate 1 and of air 13 being very different. Therefore, in the region without contact with the finger at the surface 2, a lot of light is reflected to the assigned photosensor 4.1, as is illustrated by arrow 14. A small proportion of the light radiation is transmitted to behind the surface 2 corresponding to the arrow 15.

The display pixel 6.2 shown on the right-hand side transmits the light beam according to arrow 16 to the surface 2, at which a transition from the cover plate 1 into the finger 11 takes place, with the refractive indices of the cover plate 1 and of the finger 11 being similar. In the region in which the finger 11 is placed on the surface 2, little light is therefore reflected to the photosensor 4.2 according to the arrow 17. A large proportion of the light radiation is absorbed according to the arrow 18 behind the surface 2 by the finger 11 owing to optical coupling.

When used as a scanner, a portion of the display pixels 6, in which the photosensor 4 is not active, transmits the light, and photosensors 4, the display pixels 6 of which do not transmit light, capture the light from the other display pixels that is reflected at the surface 2. One possible arrangement is one according to the pattern of a chessboard, wherein the light-emitting display pixels 6 with switched-off photosensors 4 correspond for example to the white fields and the switched-on photosensors 4 with the display pixels 6 that emit no light correspond to the black fields, or vice versa.

One possible further arrangement and manner of driving is the alternating arrangement in lines and/or columns of the light-emitting display pixels 6 with switched-off photosensors 4 and of the display pixels 6 that emit no light with the active photosensors 4.

In a first step, the active photosensors 4 capture no light reflected at the surface 1 from the own display pixel 6, but only reflected light of the object to be scanned that is located on or behind the surface 1 and is illuminated by a neighboring display pixel 6. No reflection of light is produced which was reflected by the display pixel assigned to the photosensor 4, that is to say the own display pixel, at the surface 1. An antireflection finish of the surface 1 is not necessary.

In a second step, the display pixels 6, which so far emitted no light, are activated and the previously switched-off photosensors 4 are activated such that two half images are produced which, in sum, make the full resolution possible. Since switching takes place at the display frequency, the full resolution is practically available in real time.

FIG. 6 represents the scan function in connection with the document 10 assigned to the surface 2 of the cover plate 1.

The display pixels 6.1 (illustrated on the left-hand side), of which the photosensor 4.1 that is assigned to it is not active, transmits a light beam according to the arrow 19 to the surface 2, at which a portion of the light radiation is reflected according to arrow 20 in the direction of the photosensor 4.2 which is assigned to the right-hand display pixel 6.2 which transmits no light, but beyond the capturing range of the photosensor 4.2 that is defined by the scan angle 8, which is why said reflected light radiation has an interfering effect that does not influence the measurement of the photosensor 4.2. A further portion of the emitted light penetrates the surface 2 of the cover plate 1 according to arrow 21 and is reflected according to the arrow 22 at the document 10 toward the photosensor 4.2 which measures the brightness of the surface of the document 10.

The use of the apparatus as a touch screen can take place both in the mode for recognizing a fingerprint and during scanning of a document 10 and permits exact position determination of a non-limited number of fingers 11 or styluses or such objects and forms what is known as a multi-touch display. If subpixels 5 or display pixels 6 which emit infrared light are provided, position detection is available independently of the brightness of the display device.

Furthermore, the touch screen also functions in conjunction with any desired objects, that is to say also with prostheses, and can recognize movements of objects on the surface, with the result that for a relatively large-area apparatus, many users that work at the same time with many fingers on the surface 1 are recognized.

The photosensors 4, the display pixels 6 or the subpixels 5 are of course controlled by computer and are connected, via the computer, also to a memory module and circuit and switching devices.

The specification incorporates by reference the disclosure of PCT/DE2014/100176, filed May 21, 2014.

The present invention is, of course, in no way restricted to the specific disclosure of the specification and drawings, but also encompasses any modifications within the scope of the appended claims.

REFERENCE SIGNS 1 cover plate
2 surface
3 microlens
4 photosensor
5 subpixel
6 display pixel
7 mask
8 scan angle
9 plane
10 document
11 finger
12 arrow
13 air
14 arrow
15 arrow
16 arrow
17 arrow
18 arrow
19 arrow
20 arrow
21 arrow
22 arrow

The invention claimed is:

1. A method for optically capturing a fingerprint or an object on a surface (2) of a cover plate (1) of a screen, comprising the following steps:
   providing a plurality of photosensors (4);
   providing a plurality of display pixels (6);
   assigning each of said photosensors (4) to a respective display pixel (6), wherein the display pixels (6) emit light radiation and the photosensors (4) capture light radiation from the display pixels (6) reflected by the surface (2) of the cover plate (1) of the screen within a scan angle (8), wherein the scan angle (8) corresponds in a virtual mirror image plane (9) to the size of a selected one of the display pixels (6), and wherein the scan angle (8) does not exceed the following size:

$$\alpha \leq 2 \arctan(d/4h_1)$$

wherein:
α=scan angle 8
d=edge length of the display pixel 6
$h_1$=distance from the upper side of the display pixel to the surface 2 of the cover plate.

2. The method as defined in claim 1, wherein, for capturing a fingerprint, a plurality of display pixels (6) emit light radiation, wherein a proportion of said light radiation that is emitted and that are reflected by the surface (2) are received by the photosensor (4) that is respectively assigned to the display pixel (6).

3. The method as defined in claim 1, wherein, for capturing the object placed on the surface, a plurality of display pixels (6), emit light radiation to form a chessboard pattern, wherein reflected proportions of said light radiation that is emitted are received by the photosensor (4) that is respectively assigned to the display pixel (6) that emits no light radiation.

4. The method as defined in claim 3, wherein the object is a document (10) placed on the surface (2).

5. The method as defined in claim 3, wherein the display pixels (6) are arranged in the form of a matrix or in columns and lines.

6. The method as claimed in claim 3, wherein, for recording two half images of the object that can be combined to form one image, the display pixels (6) sequentially emit light radiation or the photosensors (4) associated with the display pixels (6) receive reflected light radiation.

7. An apparatus for performing the method as defined in claim 1, comprising:
at least one screen comprising an upper optical cover plate (1);
a plurality of display pixels (6) arranged under said upper optical cover plate (1) as light sources for an image to be represented; and
a plurality of photosensors, wherein a respective one of the photosensors is assigned in each case in a centered fashion to a plurality of display pixels (6).

8. The apparatus as defined in claim 7, wherein the photosensors (4) are arranged in a central free space of the associated display pixel (6) and are surrounded by subpixels (5).

9. The apparatus as defined in claim 7, wherein the photosensors (4) are arranged on a side of the display pixels (6) that is opposite the cover plate (1), wherein each display pixel (6) comprises a plurality of subpixels (5).

10. The apparatus as defined in claim 7, wherein at least one of the display pixels (6) or a subpixel (5) of the display pixel (6) emits radiation in the infrared or ultraviolet range.

11. The apparatus as defined in claim 7, wherein the display pixels (6) or subpixels (5) of the display pixels (6) emit monochromatic or colored light.

12. The apparatus as defined in claim 7, wherein the display pixels (6) are component parts of an OLED.

13. The apparatus as defined in claim 7, wherein each photosensor (4) comprises a color filter and/or each photosensor (4) is assigned a mask (7) for screening against direct illumination by the display pixels (6).

14. The apparatus as defined in claim 13, wherein the mask (7) is a metallized mask.

15. The apparatus as defined in claim 7, wherein each photosensor (4) comprises a plurality of sub-photosensors with one color filter.

16. The apparatus as defined in claim 7, wherein each photosensor (4) or at least one of its sub-photosensors is sensitive to infrared light and/or comprises an infrared filter.

17. The apparatus as defined in claim 7, wherein each photosensor (4) is assigned a microlens (3).

18. The apparatus as defined in claim 7, wherein the microlens (3) is configured as a Fresnel lens or a holographic lens.

19. The apparatus as defined in claim 7, wherein the microlens (3) is arranged between the cover plate (1) and the photosensor (4).

20. The apparatus as defined in claim 7, wherein the screen is configured as a touch screen.

21. The apparatus as defined in claim 7, wherein at least the display pixels (6) and the photosensors (4) are connected to a computer unit and a memory module.

22. The apparatus as defined in claim 7, further comprising a switching device, wherein said switching device is coupled to a computer unit to actuate either a fingerprint recognition mode, wherein in in said fingerprint recognition mode, all display pixels (6) emit light radiation and the photosensors (4) of said display pixels (6) that are assigned thereto capture reflected light radiation, or a scan mode, wherein in said scan mode, the display pixels (6) are switched on and off sequentially in the pattern of a chessboard so as to emit light radiation, and the photosensors (4) of the respectively switched-off display pixels (6) are switched on to receive the reflected light radiation.

23. The apparatus as defined in claim 7, wherein the cover plate (1) is configured as a flexible plastic film.

24. The apparatus as defined in claim 23, wherein the plastic film is uncoated, hard-coated or covered by a further film, and/or consists of a plurality of layers film.

25. The apparatus as defined in claim 23, wherein the further film is a graphene film.

26. The use of the apparatus as defined in claim 7 as a fingerprint sensor and/or a document scanner and/or a touch screen for a mobile telephone, a smart phone, a tablet computer and/or a stationary work screen computer.

\* \* \* \* \*